(12) United States Patent
Cheng

(10) Patent No.: US 7,284,323 B2
(45) Date of Patent: Oct. 23, 2007

(54) PROCESS OF FABRICATING CONDUCTIVE COLUMN

(75) Inventor: David C. H. Cheng, Taoyuan Hsien (TW)

(73) Assignee: Unimicron Technology Corp., Taoyuan (TW)

( * ) Notice: Subject to any disclaimer, the term of this patent is extended or adjusted under 35 U.S.C. 154(b) by 116 days.

(21) Appl. No.: 10/711,863

(22) Filed: Oct. 11, 2004

(65) Prior Publication Data

US 2006/0021794 A1 Feb. 2, 2006

(30) Foreign Application Priority Data

Jul. 27, 2004 (TW) .............................. 93122358 A

(51) Int. Cl.
*H01K 3/10* (2006.01)
(52) U.S. Cl. .......................................... 29/853; 29/847
(58) Field of Classification Search ........ 174/262–266; 361/792–795; 29/846, 847, 852, 853
See application file for complete search history.

(56) References Cited

U.S. PATENT DOCUMENTS

| 3,148,310 | A | * | 9/1964 | Feldman ..................... 174/265 |
| 3,354,543 | A | * | 11/1967 | Lawrence et al. ............ 29/853 |
| 5,232,548 | A | * | 8/1993 | Ehrenberg et al. ............ 216/18 |
| 6,114,240 | A | * | 9/2000 | Akram et al. ................ 438/667 |
| 6,211,468 | B1 | * | 4/2001 | Windschitl ................... 174/254 |
| 6,274,820 | B1 | * | 8/2001 | DiStefano et al. .......... 174/254 |
| 6,486,394 | B1 | * | 11/2002 | Schmidt et al. ............... 174/36 |

* cited by examiner

*Primary Examiner*—Jeremy C Norris
(74) *Attorney, Agent, or Firm*—Jianq Chyun IP Office

(57) ABSTRACT

A fabrication process of a conductive column suitable for a fabrication of a circuit board. The circuit board comprises a dielectric layer. A first blind hole is formed in the dielectric layer from a second surface opposite to the first surface, wherein the blind end of the first blind hole connects to the blind end of the second blind hole. The first blind hole and the second blind hole constitute a Through hole. The through hole is formed in an hourglass shape such that an inner diameter of the through hole near the first or the second surface is substantially larger than an inner diameter of the through hole near a middle portion of the through hole. A conductive material is filled in the though hole to form a conductive column.

10 Claims, 3 Drawing Sheets

PROCESS OF FABRICATING CONDUCTIVE COLUMN

CROSS-REFERENCE TO RELATED APPLICATION

This application claims the priority benefit of Taiwan application serial no. 93122358, filed on Jul. 27, 2004.

BACKGROUND OF THE INVENTION

1. Field of the Invention

The present invention relates to a method of fabricating a conductive column, and more particularly to a method of fabricating a conductive column, which is adapted for fabricating a circuit board.

2. Description of Related Art

In semiconductor packaging process, circuit boards have been widely used due to their compatibility with complex circuit patterns, high integration and excellent performance. Circuit boards comprise patterned circuit layers and dielectric layers which are alternately deposited. For example, the method of forming circuit boards includes the laminating process and the build-up process. Regardless of the above mentioned methods, the patterned circuit layers are interconnected through conductive vias. The method of forming conductive vias includes conductive-through-via process, conductive-embedded-via process and conductive-blind-via process.

FIG. 1 is a cross sectional view showing a prior art circuit board with a plated through hole (PTH). The circuit board 100 comprises a dielectric layer 110 comprising a material such as epoxy resin or epoxy resin with glass fiber. A first conductive layer 120, comprised of, for example, a copper foil, is formed over a first surface 112 of the dielectric layer 110. A second conductive layer 130, comprised of, for example, a copper foil, is formed over a second surface 114 of the dielectric layer 110 opposite to the first surface 112. In order to electrically connect the first conductive layer 120 with the second conductive layer 130 through the dielectric layer 110, a plating-through-hole process is carried out. In the plating-through-hole process, a through hole 102 is formed in the dielectric layer 110, the first conductive layer 120 and the second conductive layer 130 by using a drilling process. An plating process is carried out to deposit a conductive material on the sidewalls of the through hole 102 and the surfaces of the first conductive layer 120 and the second conductive layer 130 so as to form an plating layer 140. Accordingly, the conductive via 142 of the plating layer 140 formed on the sidewalls of the through hole 102 electrically connects the first conductive layer 120 with the second conductive layer 130. Thereafter, downstream processes can be carried out to complete the fabrication of the circuit board 100.

In addition to the plating-through-hole process, a plating-filling-hole process can be further carried out to fill the through hole with a conductive material so as to form a conductive column, which can enhance heat dissipation of the circuit board. FIG. 2A is a cross sectional view showing another prior art circuit board with a conductive column, which is similar to the prior art described above, except that at least one through hole 202 is formed in the dielectric layer 210, a first conductive layer 220 and a second conductive layer 230 by using a drilling process, and then an plating process is carried out to deposit a conductive material on the sidewalls of the through hole 202 and the surfaces of the first conductive layer 220 and the second conductive layer 230 to form the plating layer 240, wherein the plating layer 240 fills the through hole 202 to form a conductive column 242. Compared with the conductive via 142 of the plating layer 140 in the through hole 102 in FIG. 1, the conductive column 242 in FIG. 2A has a greater heat dissipation area which improves heat dissipation of the circuit board 200a.

FIG. 2B is a cross sectional view showing a prior art circuit board with a defective conductive column. During the plating-filling-hole process, the point discharging phenomenon occurs at two sharp edges of the through hole 202. It is believed that the point discharging phenomenon at the sharp edge 220a of the first conductive layer 220 and the sharp edge 230a of the second conductive layer 230 is most likely due to larger point discharge currents. The larger currents cause the conductive material to deposit faster on the sharp edge 220a of the first conductive layer 220 and the sharp edge 230a of the second conductive layer 230, and the conductive material deposited on the sharp edge 220a of the first conductive layer 220 and the sharp edge 230a of the second conductive layer 230 extend towards the center of the through hole 202. As a result, a void 242a is easily formed in the conductive column 242 formed in the through hole 202. The void 242a reduces the heat dissipation area of the conductive column 242. Accordingly, the heat dissipation of the circuit board 200b is lower than that of the circuit board 200a in FIG. 2A.

SUMMARY OF THE INVENTION

Accordingly, the present invention is directed to a method of fabricating a conductive column suitable in a fabrication of a circuit board so as to improve the yield of the conductive column on the circuit board.

According to an embodiment of the present invention, a circuit board comprising a dielectric layer formed thereon is provided. Next, a first blind hole is formed in a first surface of the dielectric layer. A second blind hole is formed in a second surface of the dielectric layer opposite to the first surface. A blind end of the first blind hole connects to a blind end of the second blind hole. The first blind hole and the second blind hole constitute a through hole. An inner diameter of the through hole near the first surface or the second surface is substantially larger than an inner diameter of the through hole near a middle portion of the through hole. A conductive material is filled into the through hole so as to form a conductive column.

According to an embodiment of the present invention, the first blind hole and the second blind hole have a cone shape, and the through hole and the conductive column have an hourglass shape. In addition, the circuit board further comprises a first conductive layer disposed over a first surface of the dielectric layer. After forming the first blind hole in the dielectric layer, the first blind hole is passed through the first conductive layer. The circuit board further comprises a second conductive layer disposed over the second surface of the dielectric layer. After forming the second blind hole in the dielectric layer, the second blind hole is passed through the second conductive layer.

According to an embodiment of the present invention, the method of forming the first blind hole and the second blind hole comprises mechanical drilling or laser drilling.

According to an embodiment of the present invention, the step of filling the conductive material comprises plating, wherein the conductive material fills the through hole from the location where the blind ends of the first and second blind holes connect with each other in the through hole and extends towards the first surface and the second surface.

Accordingly, an hourglass-like through hole is formed in the dielectric layer. A conductive material is then filled into the hourglass-like through hole to form an hourglass-like conductive column. Because the through hole is formed in an hourglass-shape, the conductive material can be easily filled into the through hole so as to improve the yield of the conductive column. When a plating process is carried out to fill the hourglass-like through hole, the point discharging phenomenon occurs at the location where the blind ends of the first and second blind holes connect with each other in the hourglass-like through hole. As a result, the conductive material fills the through hole from a middle portion of the hourglass-like through hole and extends towards the first surface and the second surface so as to form a conductive column. The conductive column has a substantially hourglass shape. Thus, the possibility of forming voids in the conductive columns can be effectively reduced and the yield of the conductive columns can be effectively promoted.

The above and other features of the present invention will be better understood from the following detailed description of the preferred embodiments of the invention that is provided in communication with the accompanying drawings.

DESCRIPTION OF EMBODIMENTS

Figure 1:
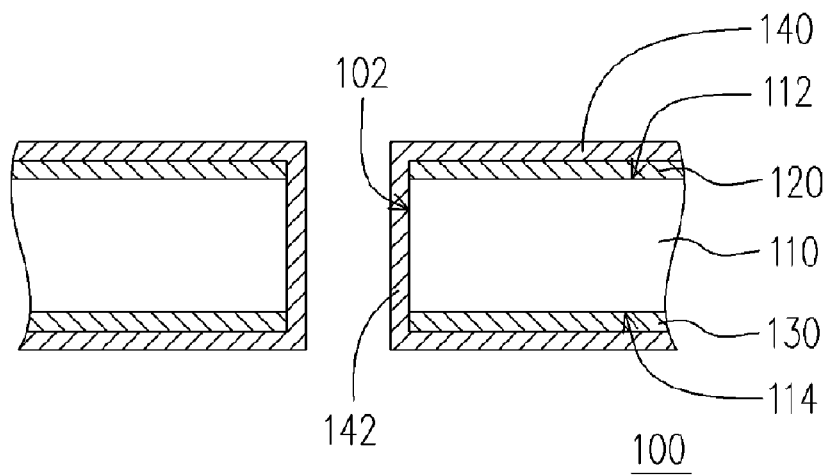
FIG. 1 is a cross sectional view showing a prior art circuit board with a plated through hole (PTH).
Figure 2A:
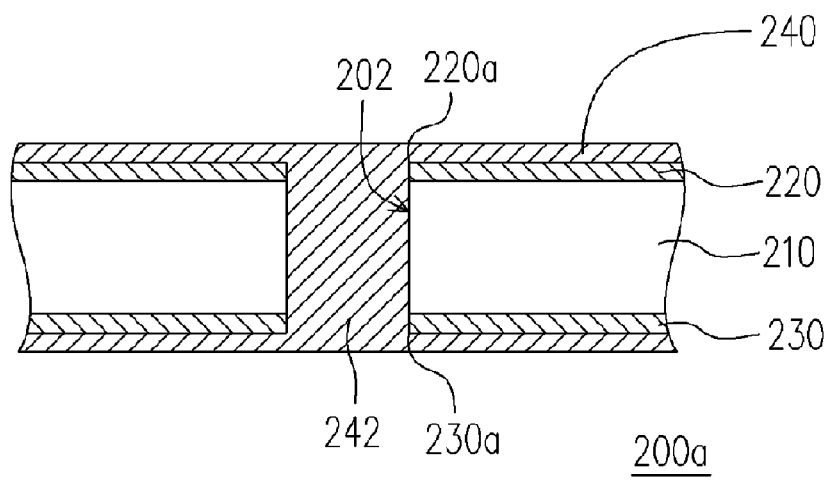
FIG. 2A is a cross sectional view showing a prior art circuit board with a conductive column.
Figure 2B:
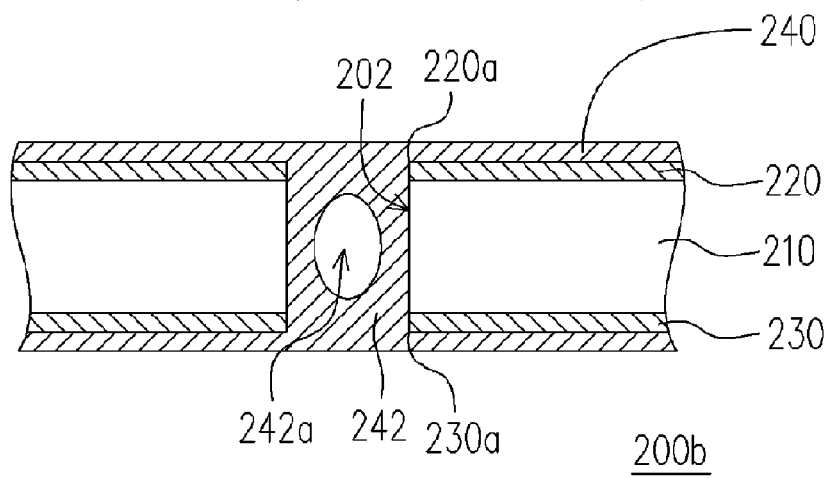
FIG. 2B is a cross sectional view showing a prior art circuit board with a defective conductive column.
Figure 3A:
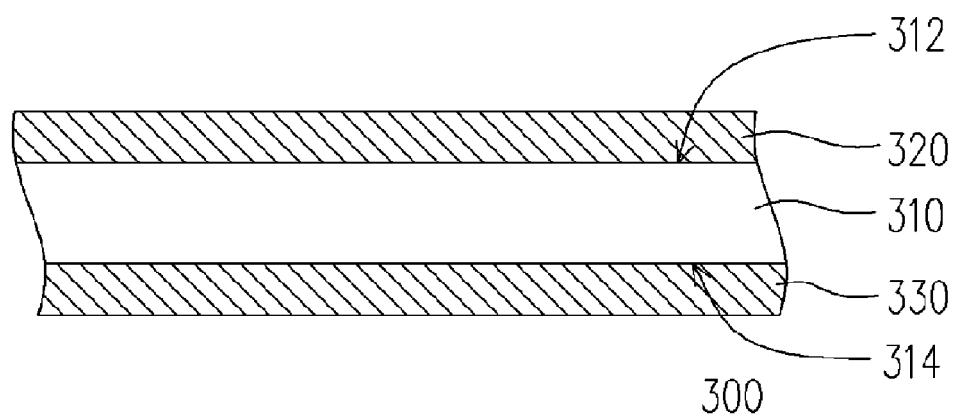
FIGS. 3A-3F are schematic cross-sectional views showing a method fabricating a conductive column according to an embodiment of the present invention.

FIGS. 3A-3F are schematic cross-sectional views showing a method of fabricating a conductive column according to an embodiment of the present invention. Referring to FIG. 3A, a circuit board 300 is provided. The circuit board 300 can be a double-face plate, e.g. a dielectric layer having two conductive layers on each surface thereof; a single-face plate, e.g. a dielectric layer having a conductive layer on a surface of the dielectric layer, or a dielectric layer. In this embodiment, the circuit board 300 is a double-face plate. The circuit board 300 comprises a dielectric layer 310 comprising a material such as epoxy resin or epoxy resin with glass fiber. The first surface 312 of the dielectric layer 310 comprises a first conductive layer 320 formed thereon, which can be, for example, a copper foil. In addition, the second surface 314 of the dielectric layer 310 opposite to the first surface 312 comprises a second conductive layer 330 formed thereon, which can be, for example, a copper foil.

Figure 3B:
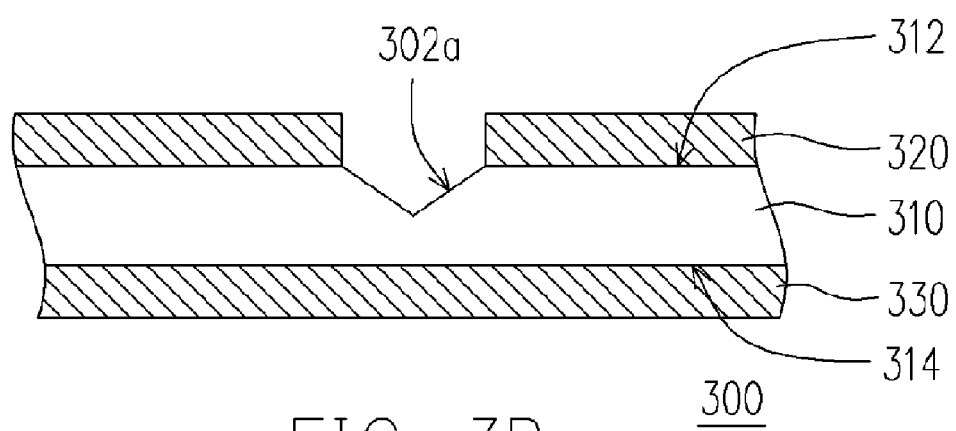

A process of electrically connecting the first conductive layer 220 with the second conductive layer 230 through the dielectric layer 210 is described as follows. Referring to FIG. 3B, a first blind hole 302a is formed in the dielectric layer 310 and the first conductive layer 320. The first blind hole 302a can be formed, for example, by mechanical drilling or laser drilling method. When the mechanical drilling is used to formed the first blind hole 302a, the first blind hole 302a has a cone shape similar to the shape of the drilling head. Accordingly, a cone-shape blind hole 302a is formed in the dielectric layer 310 and the first conductive layer 320. When the laser drilling is used to form the first blind hole 302a, spiral cutting and the controlling of the laser power can be used to form a cone-shape blind hole 302a. Accordingly, it should be noted that regardless of the method used for forming the blind hole, the inner diameter of the blind end of the blind hole 302a near to the middle portion of the dielectric layer 310 is preferably smaller than that of the open end of the blind hole 302a adjacent to the first surface 312.

Figure 3C:
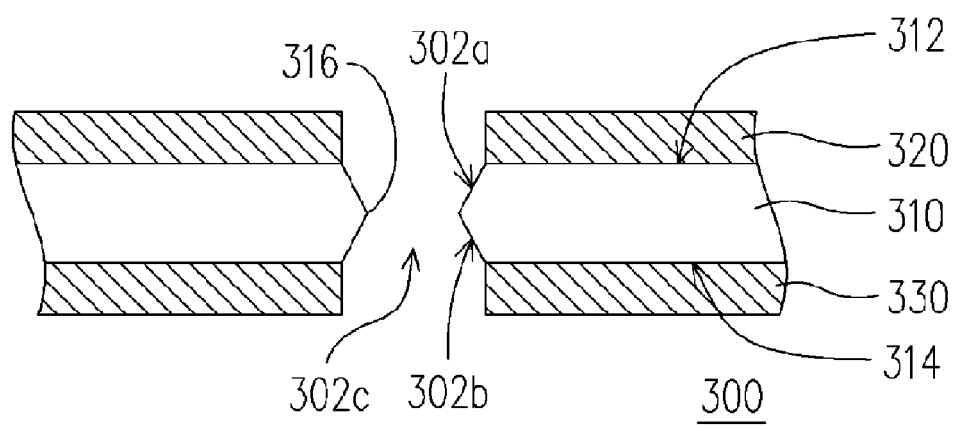

Referring to FIG. 3C, after the first blind hole 302a is formed in the dielectric layer 310 and the first conductive layer 320, a second blind hole 302b is formed in the dielectric layer 310 and the second conductive layer 330 from the second surface 314 of the dielectric layer 310 opposite to the first surface 312. The second blind hole 302b can be formed, for example, by mechanical drilling or laser drilling method. The second blind hole 302b has a cone shape similar to that of the first blind hole 302a. The drilling method is continued until the blind end of the second blind hole 302b connects to the blind end of the first blind hole 302a so as to form a through hole 302c. Because both the first blind hole 302a and the second blind hole 302b have a cone shape, an inner diameter of the through hole 302c near the first surface 312 or the second surface 314 is substantially larger than an inner diameter of the through hole 302c near a middle portion of the through hole 302c. Thus, the through hole 302c is formed in an hourglass shape. Because, the inner diameter of the through hole 302c near the first surface 312 or the second surface 314 substantially larger than an inner diameter of the through hole 302c near a middle portion of the through hole 302c, a ring tip 316 is formed where the blind ends of the first and second blind holes connect with each other forming the through hole 302c in the dielectric layer 310.

Figure 3D:
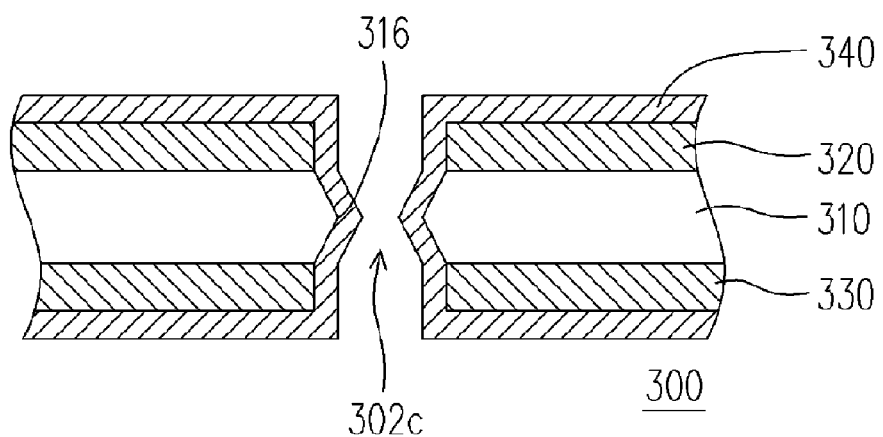
Figure 3E:
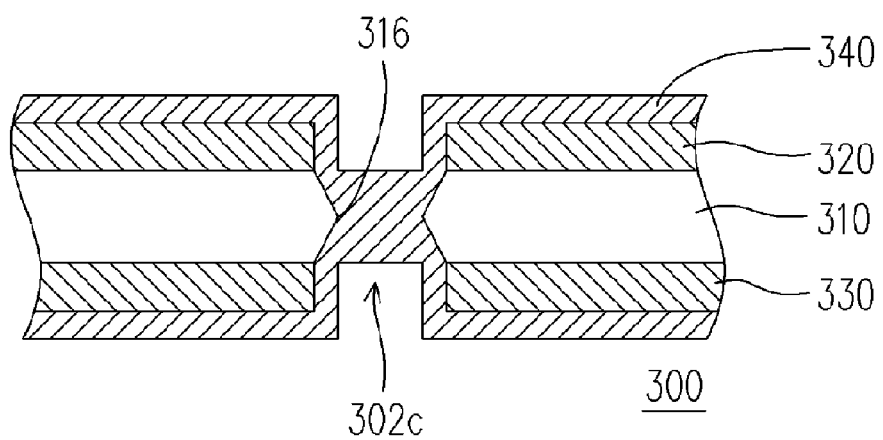
Figure 3F:
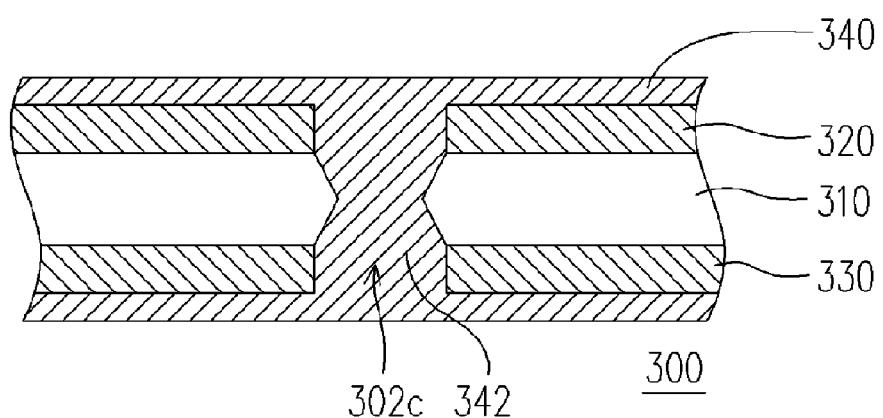

Hereinafter, a process of filling the through hole 302c is described with reference to FIGS. 3D-3F. In this embodiment, for example, a plating process may be carried out to fill a desired conductive material into the through hole 302c. According to an embodiment of the present invention, prior to conducting the plating process, a chemical plating process, i.e. an electroless plating, is carried out to deposit a plating seed layer (not shown) on the sidewalls of the through hole 302c, the first conductive layer 320 and the second conductive layer 330. The plating process is then carried out to deposit a desired conductive material, for example copper, on the plating seed layer on the sidewalls of the through hole 302c, the first conductive layer 320 and the second conductive layer 330 to form an plating layer 316 as shown in FIG. 3D. The plating process is continued until the through hole 302c is completely filled with the conductive material to form a conductive column 342 as shown in FIGS. 3E-3F.

While the through hole 302c is being filled with the conductive material during the plating process, the ring tip 316 is formed at the center portion of the through hole 302c in the dielectric layer 310 is adapted to cause a point discharging phenomenon, i.e. excessive amount of charges accumulate at the ring tip 316. As a result, the conductive material deposits at the ring tip 316 at a faster rate compared to elsewhere. Thus, the conductive material fills the through holes 302 substantially from the middle portion where the ring tip 316 is located towards the first surface 312 and the second surface 314 to form a conductive column 342 in the through hole 302c. Since the through hole 302c has an hourglass-like shape, the conductive column 342 in the through hole 302c will also have an hourglass-like shape.

It should be noted that even though the circuit board 300 according to the embodiment of the present invention is a double-face plate, however it can also be a single-face plate or a dielectric layer. It should be further noted that the scope of the present invention pertains to a method of fabricating the conductive column. The other downstream processes for fabricating the circuit board 300 depends on the type of layers, patterns of the circuits and micro vias of the circuit board 300. Detailed descriptions thereof are not included herein.

Accordingly, an hourglass-like through hole is formed in the dielectric layer and then a conductive material is filled into the through hole to form an hourglass-like conductive column. Because of the hourglass-shape through hole, the conductive material can be easily filled into the through hole. Thus, the yield of the conductive column can be effectively promoted. It should be further noted that the hourglass-like through hole causes the point discharging phenomenon at the central portion thereof and thus the conductive layer deposits at the central portion of the hourglass like through hole at a faster rate. As a result, the conductive material fills the through hole from the location where the blind ends of the first and second blind holes connect with each other in the through hole and extends towards the first surface and or the second surface to form a conductive column. The conductive column has a substantially hourglass shape. Accordingly, the possibility of forming voids in the conductive columns can be effectively reduced and the yield of the conductive columns can be effectively promoted.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A method of forming conductive column in a fabrication of a circuit board, the circuit board comprising a dielectric layer formed thereon, the method comprising:

forming a first blind hole in a first surface of the dielectric layer;

forming a second blind hole in a second surface of the dielectric layer opposite to the first surface, a blind end of the first blind hole connecting to a blind end of the second blind hole, the first blind hole and the second blind hole constituting a through hole, wherein an inner diameter of the through hole near the first surface or the second surface is substantially larger than an inner diameter of the through hole near a middle portion of the through hole; and filling a conductive material in the through hole, wherein the conductive material fills with the through hole from a position wherein the blind ends of the first and second blind holes connect with each other and extends towards two ends of the through hole to form a conductive column.

2. The method of forming conductive column of claim 1, wherein the first blind hole and the second blind hole have a cone shape, and the through hole and the conductive column have an hourglass shape.

3. The method of forming conductive column of claim 1, wherein the circuit board further comprises a first conductive layer disposed over the first surface of the dielectric layer, and after forming the first blind hole in the dielectric layer, the first blind hole is passed through the first conductive layer.

4. The method of forming conductive column of claim 3, wherein the circuit board further comprises a second conductive layer disposed over the second surface of the dielectric layer, and after forming the second blind hole in the dielectric layer, the second blind hole is passed through the second conductive layer.

5. The method of forming conductive column of claim 1, wherein the first blind hole is formed by a mechanical drilling method.

6. The method of forming conductive column of claim 5, wherein the second blind hole is formed by a mechanical drilling method.

7. The method of forming conductive column of claim 1, wherein the first blind hole is formed by a laser drilling method.

8. The method of forming conductive column of claim 7, wherein the second blind hole is formed by a laser drilling method.

9. The method of forming conductive column of claim 1, wherein the step of filling the conductive material comprises plating process.

10. The method of forming conductive column of claim 1, wherein the conductive column is a solid column full of the through hole.

* * * * *